United States Patent [19]

Wen

[11] Patent Number: 5,792,697

[45] Date of Patent: Aug. 11, 1998

[54] METHOD FOR FABRICATING A MULTI-STAGE ROM

[75] Inventor: Jemmy Wen, Hsinchu City, Taiwan

[73] Assignee: United Microelectronics Corporation, Taiwan

[21] Appl. No.: 838,979

[22] Filed: Apr. 23, 1997

[30] Foreign Application Priority Data

Jan. 7, 1997 [TW] Taiwan .................. 86100117

[51] Int. Cl.$^6$ .................. H01L 21/8246; H01L 21/8234
[52] U.S. Cl. .................. 438/275; 438/277; 438/282
[58] Field of Search .................. 438/275–279, 438/128, 282; 257/390–392

[56] References Cited

U.S. PATENT DOCUMENTS 4,180,826  12/1979  Shappir ................ 438/275

5,394,356  2/1995  Yang .................... 438/276

*Primary Examiner*—Joni Chang
*Attorney, Agent, or Firm*—Rabin & Champagne, P.C.

[57] ABSTRACT

A method of forming a multi-stage ROM which replaces the multiple code implant. A gate oxide layer, a first polysilicon layer, an oxide layer, a second polysilicon layer and a silicon nitride layer are formed over a substrate in succession. Then, the silicon nitride layer, the second polysilicon layer, the oxide layer, the first polysilicon layer and the gate oxide layer are patterned at the same time so that a number of double-layer polysilicon lines remain. An implantation is performed on an exposed region to form a number of source/drain regions which serve as bit lines. The double-layer polysilicon lines are patterned to form a number of gates, wherein each of the gates combines with the adjacent source/drain regions to form four memory cells. Two coding processes are performed to accomplish the process of manufacturing a multi-stage ROM.

11 Claims, 7 Drawing Sheets

METHOD FOR FABRICATING A MULTI-STAGE ROM

BACKGROUND OF THE INVENTION

1. Field of the Invention

The invention relates in general to a method of fabricating an integrated circuit device, and more particularly to a method of fabricating a multi-stage read only memory.

2. Description of the Related Art

Read only memory (ROM) has been widely used in minicomputers, microprocessors and other digital hardware similar in kind. A ROM can be used to store information of a system, for example, a basic input output system (BIOS). Because of the complexity of processes for manufacturing ROM, much time is spent in each of the manufacturing steps and the pretreatment. Therefore, customers usually deliver programming data to the factory for fabricating the ROMs, where partially completed ROMs are programmed to produce a finished product.

Because most ROM devices have the same structure, except for data stored in the programming step, in most integrated circuit (IC) factories, mask ROMs are partially produced without performing programming, and are stocked. After receiving an order for special programming from a customer, a mask is produced to perform a programming step and finish the production, so that the lead time can be reduced to bring better service to customers. Therefore, post-programmed mask ROM is commonly used in the art.

Figure 1:
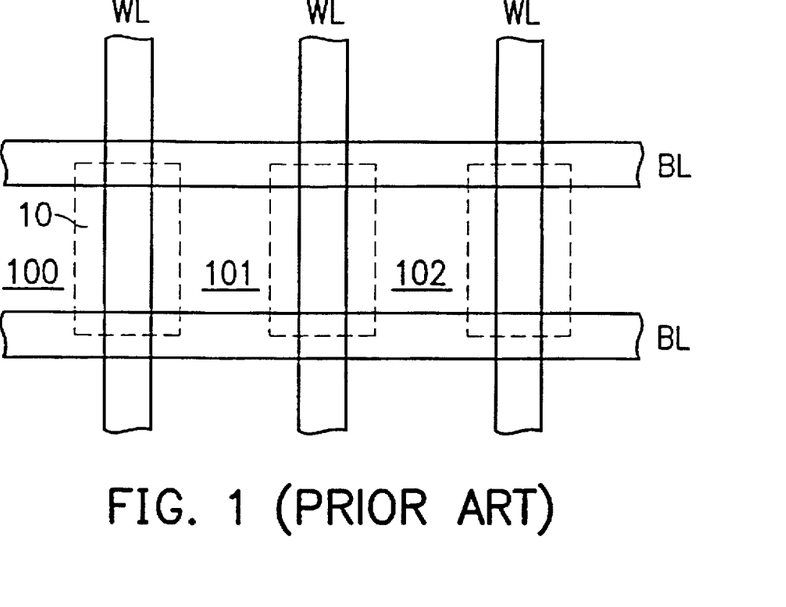
FIG. 1 (Prior Art) is a top view illustrating the layout of conventional memory cells of a ROM.

Generally, a channel transistor is used as a memory cell for ROM. In the programming process, a number of channel transistors have impurities selectively implanted into specific channel regions to modify the threshold voltages of the transistors. In this way, the conductivity of the memory cells can be controlled. FIG. 1 is a top view of the integrated circuit layout of memory cells labeled 100, 101, 102 in a ROM. A polysilicon word line (WL) bestrides a polysilicon bit line (BL). The channel 10 of the memory cell 100 is formed under the word line and between the bit lines. The data in binary form is stored in the memory cell by the implantation of impurities in the channel 10.

Figure 2:
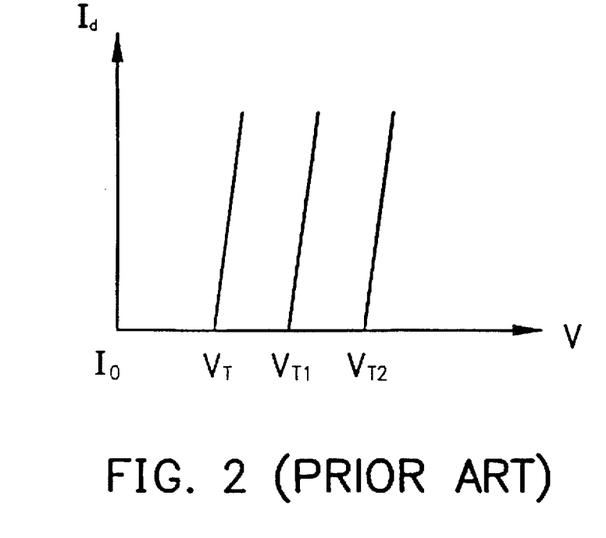
FIG. 2 (Prior Art) is a plot of the relationship of the threshold voltage and the drain current for different memory cells, wherein different threshold voltages and drain currents are generated by an implanting technique for specific channel regions.

Because of the limited memory capacity of a binary-stage ROM, a technology of fabricating a triple-stage even multi-stage ROM has been developed. Presently, for multi-stage read only memory, multiple code implanting is used to produce different threshold voltages of memory cells to construct a multi-stage logic stage. As shown in FIG. 2, the memory cells are provided with different threshold voltages $V_T$, $V_{T1}$, $V_{T2}$ by implanting ions into specific channel regions.

SUMMARY OF THE INVENTION

It is therefore an object of the invention to provide a method for fabricating a multi-stage ROM without multiple code implanting.

The invention achieves the above-identified object by providing a new method of forming a multi-stage read only memory. In accordance with one preferred embodiment of the invention, a gate oxide layer, a first polysilicon layer, an oxide layer, a second polysilicon layer and a silicon nitride layer are formed over a silicon substrate in succession. Then, the silicon nitride layer, the second polysilicon layer, the oxide layer, the first polysilicon layer and the gate oxide layer are patterned at the same time so that a region of an upper surface of the substrate at which a bit line is to be formed is exposed, and a number of double-layer polysilicon lines remain. An implantation is performed on the exposed region to form a number of source/drain regions serve as the bit lines. The double-layer polysilicon lines are patterned to form a number of gates, wherein each of the gates combines with the adjacent source/drain regions to form a memory cell, and the memory cells are classified among four kinds corresponding to a first memory cell, a second memory cell, a third memory cell, and a fourth memory cell. A planarized insulating layer is formed over the substrate and the memory cells. Thereafter, the first memory cell and the second memory cell are patterned so that a portion of the oxide layer of the first memory cell and the second memory cell is exposed. The first memory cell is patterned so that a portion of the first polysilicon layer of the first memory cell is exposed. The third memory cell is patterned so that a portion of the silicon nitride layer of the third memory cell is exposed. A conductive layer is formed over the insulating layer.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 3A:
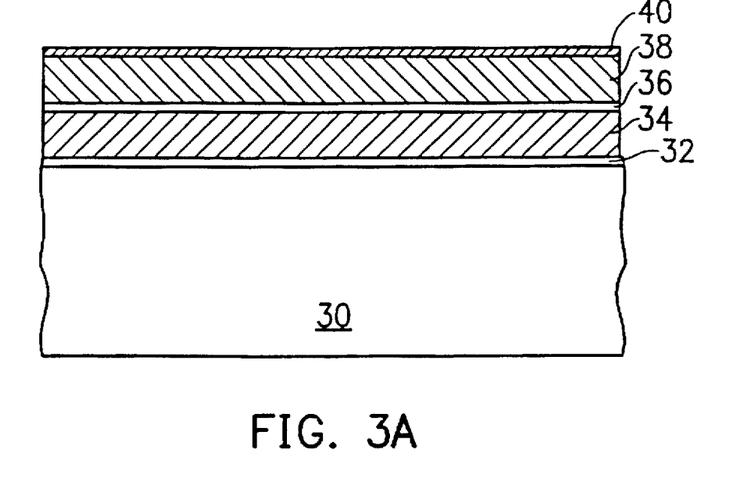
FIGS. 3A through 3H illustrate fabrication process steps of one preferred embodiment of a multi-stage ROM according to the invention.

Referring to FIG. 3A, a semiconductor substrate 30, for example, a P-type silicon substrate is provided. A gate dielectric layer 32, a first polysilicon layer 34, a first dielectric layer 36, a second polysilicon layer 38, and a second dielectric layer 40 are formed over the substrate 30 in succession. The material of the gate dielectric layer 32 and the first dielectric layer 36 includes silicon oxide, and the material of the first dielectric layer includes silicon nitride.

Figure 3B:
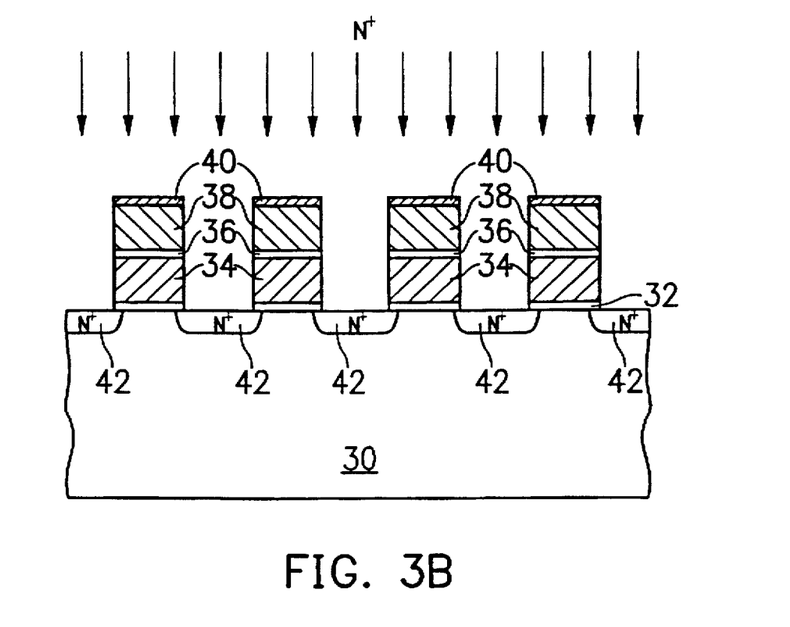
Figure 4A:
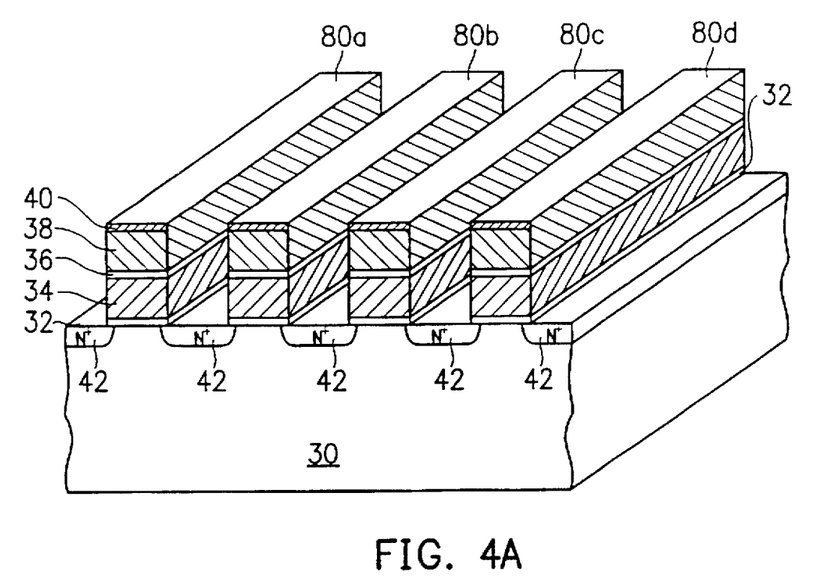
FIG. 4A and FIG. 4B are schematic three-dimensional views of memory cells of the multi-stage ROM according to FIG. 3B and FIG. 3C, respectively.

Referring to FIG. 3B and FIG. 4A, a photolithography process is performed, a first photoresist layer is spin-coated on the second dielectric layer 40 (not shown in FIG. 3B), and then developed and fixed to expose a portion of the upper surface of the second dielectric layer 40. Then, a portion of the second dielectric layer 40, the second polysilicon layer 38, the first dielectric layer 36, the first polysilicon layer 34 and the gate dielectric layer 32 are etched to expose a region of the upper surface of the substrate 30 being prepared to be a bit line. The first photoresist layer is then stripped. Therefore, a number of double-layer polysilicon lines 80a, 80b, 80c and 80d remain on the substrate 30. Using the double-layer polysilicon lines 80a, 80b, 80c and 80d as a mask, a self-aligning impurity implanting process is performed to form a number of source/drain regions 42 which serve as the bit lines.

Figure 3C:
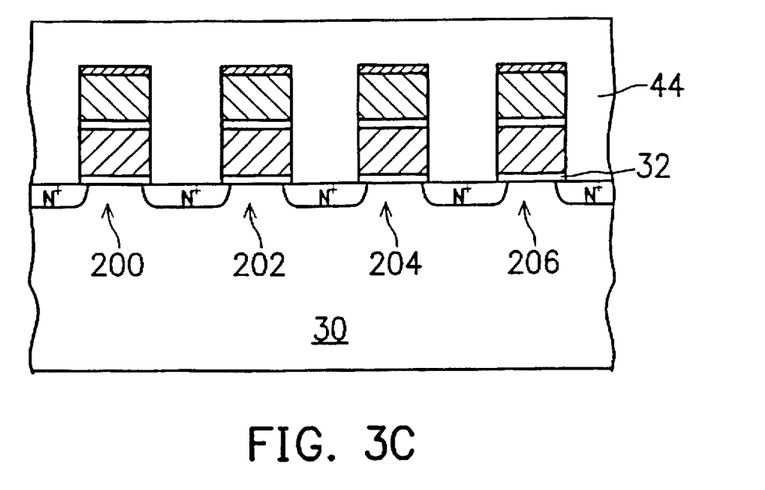
Figure 4B:
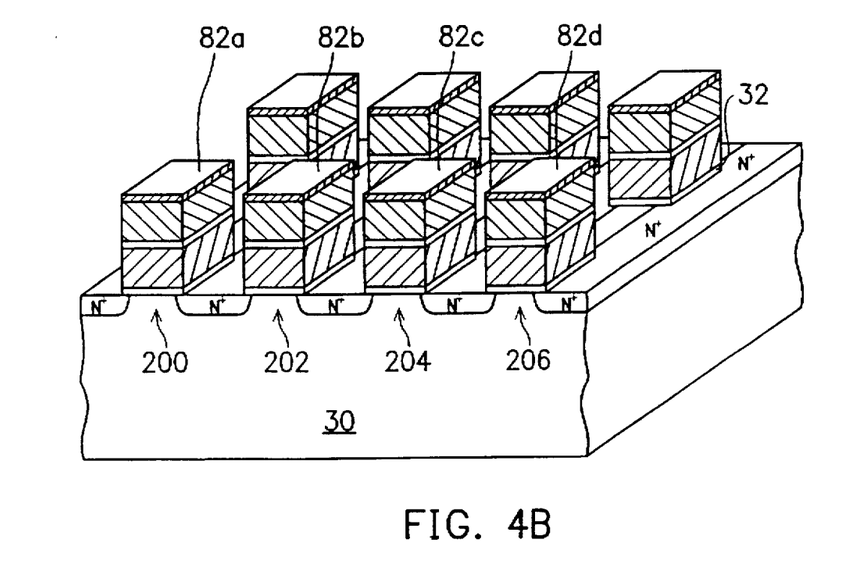

Referring to FIG. 3C and FIG. 4B, a portion of the double-layer polysilicon lines 80a, 80b, 80c and 80d is etched to form a number of gates 82a, 82b, 82c, and 82d. Each of the gates is combined with the two adjacent source/drain regions 42 to form a memory cell. The memory cells may be classified as four kinds corresponding respectively to: a first memory cell 200, a second memory cell 202, a third memory cell 204 and a fourth memory cell 206. The channels of the memory cells are formed under the gates. Then, an insulating layer 44 is formed over the substrate 30, so that the memory cells 200, 202, 204, 206 are covered by the insulating layer 44. The forming of the insulating layer 44 includes forming an oxide layer using chemical vapor deposition (CVD) and etching back the oxide layer, or spin-coating a spin-on glass (SOG).

Figure 3D:
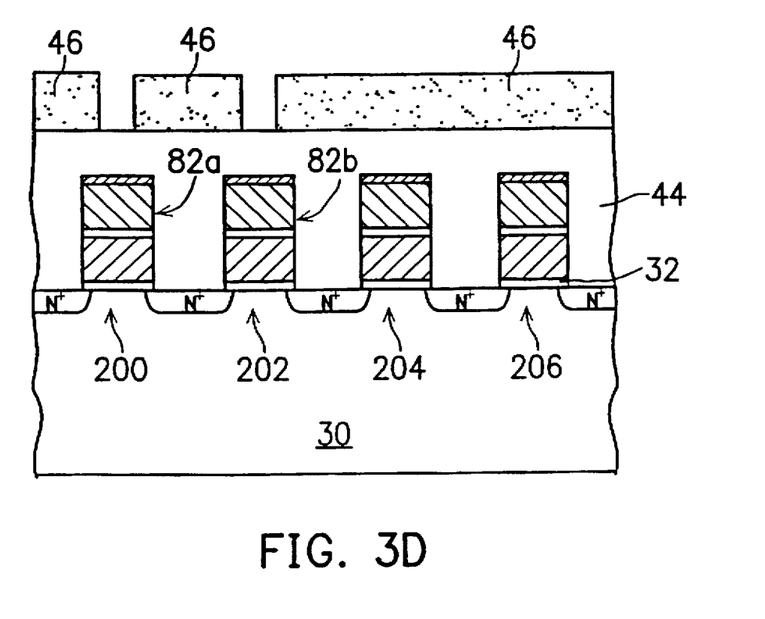

Referring to FIG. 3D, a first coding process is begun. A second photoresist layer 46 is spin-coated over the substrate 30, and then developed and fixed to expose a portion of the insulating layer 44 which is above the gate 82a of the first memory cell 200 and the gate 82b of the second memory cell 202.

Figure 3E:
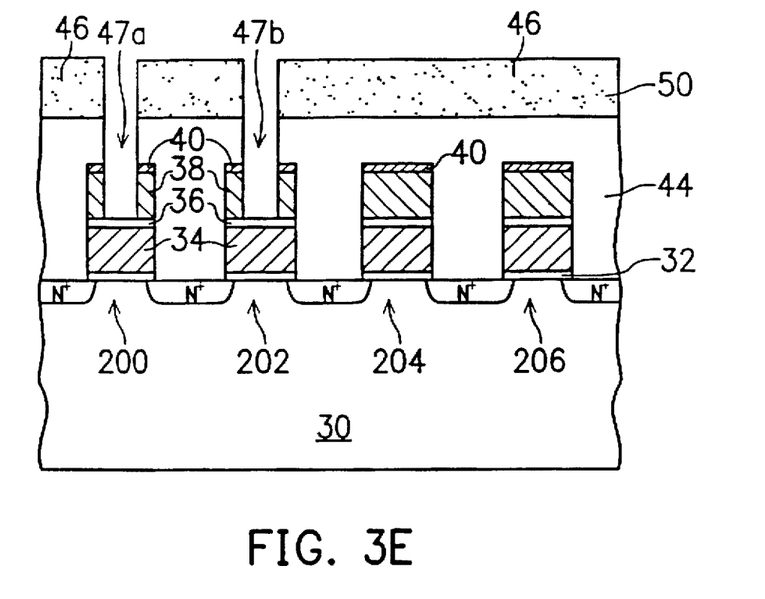

Referring to FIG. 3E, the exposed gates 82a, 82b are etched to expose the first dielectric layer 36. That is, the exposed insulating layer 44, the second dielectric layer 40 and the second polysilicon layer 38 are etched successively to expose the first dielectric layer 36 and form two opening 47a, 47b. Then, the second photoresist layer 46 is stripped, and the first coding process has been completed.

Figure 3F:
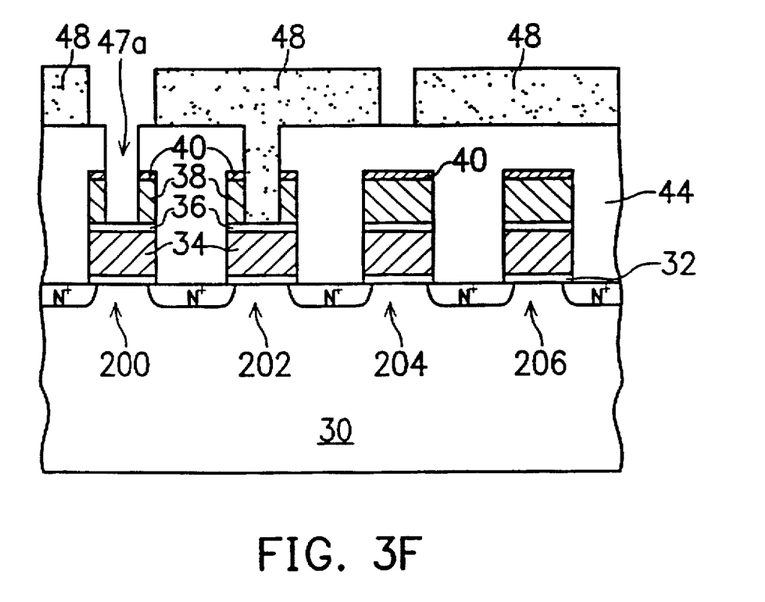
Figure 3G:
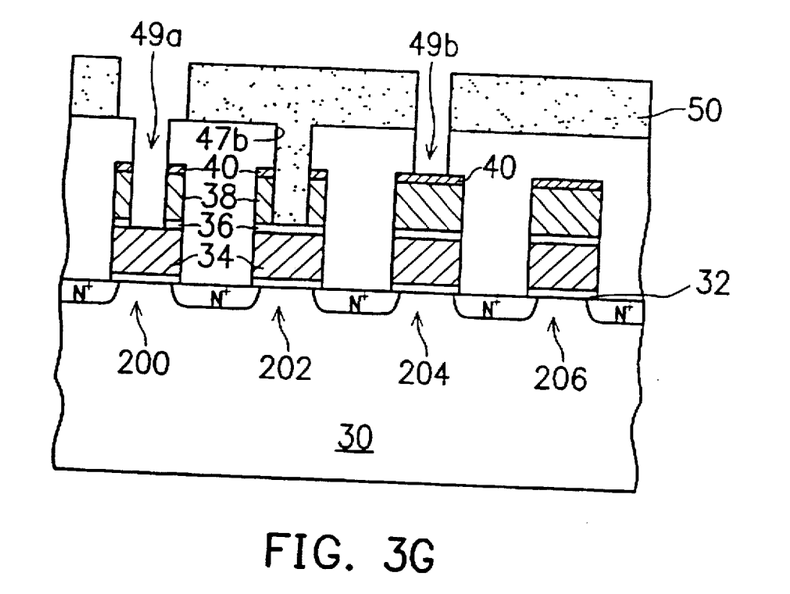
Figure 3H:
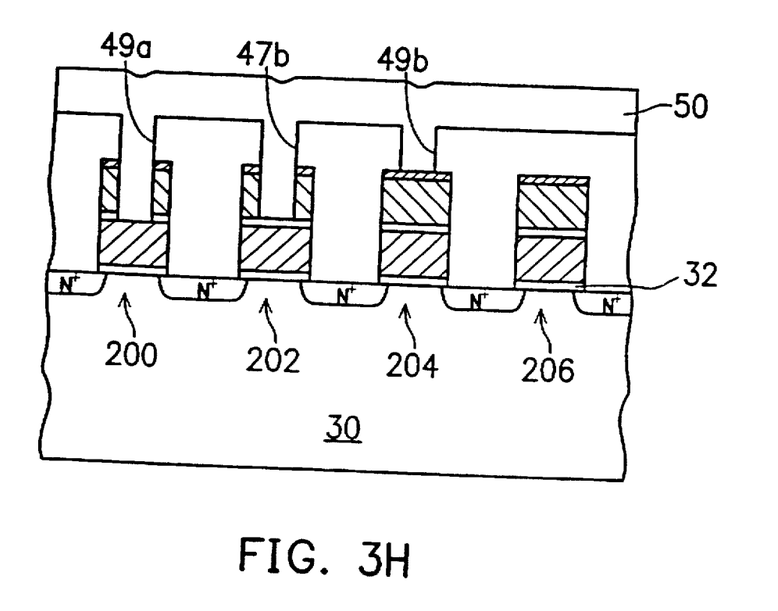

Referring to FIG. 3F, a second coding process is performed. Similarly, a photolithography process is performed, a third photoresist layer 48 is spin-coated over the substrate 30, and then developed and fixed to expose a portion of the insulating layer 44 which is above the gate 82a of the first memory cell 200 and the gate 82c of the third memory cell 204. Referring to FIG. 3G, the exposed gate 82a is etched to expose the first polysilicon layer 34. That is, the exposed first dielectric layer 36 is etched to expose the first polysilicon layer 34 and form an opening 49a. The exposed gate 82c is then etched to expose the second dielectric layer 40. That is, the exposed insulating layer 44 is etched to expose the second dielectric layer 40 and form an opening 49b. Then, the third photoresist layer 50 is stripped. This completes the first coding process, and the contact windows of a bit line are formed at the same time. Referring to FIG. 3H, a conductive layer 50 is formed over the substrate 30 to fill the openings 47b, 49a, 49b. This completes the process of manufacturing a multi-stage read only memory.

Figure 5:
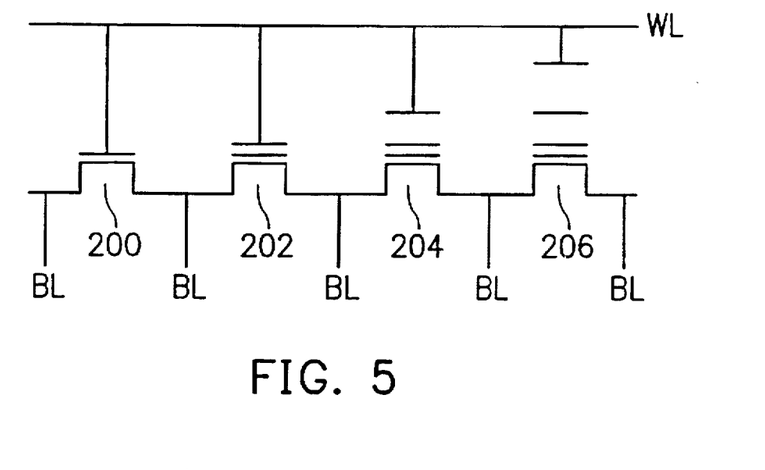
FIG. 5 is a schematic circuit diagram of memory cells of the multi-stage ROM according to FIG. 3H.
Figure 6:
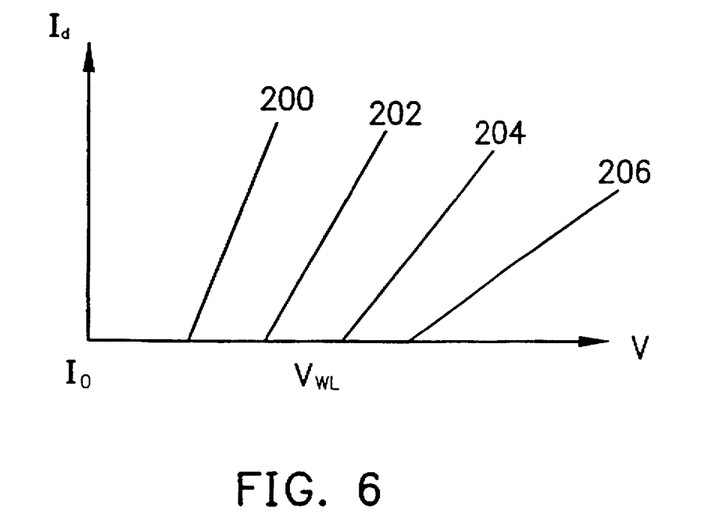
FIG. 6 is a plot of the relationship of the threshold voltage and the drain current for memory cells of the multi-stage ROM according to FIG. 5.

Referring to FIG. 5, a symbol "WL" represents a word line, while a symbol "BL" represents a bit line. According to FIG. 5 and FIG. 6, the memory cells of four kinds in accordance with the invention have different threshold voltages due to the different gate coupling electric fields, so that a multi-stage logic is obtained. Because of the simple manufacturing process of the invention, two coding processes replace the conventional multiple code implant. Not only is the process of manufacturing a multi-stage ROM simplified, but also the capacity of the multi-stage ROM is improved.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming a read only memory, comprising:

successively forming a gate dielectric layer, a first polysilicon layer, a first dielectric layer, a second polysilicon layer and a second dielectric layer over a semiconductor substrate;

patterning the second dielectric layer, the second polysilicon layer, the first dielectric layer, the first polysilicon layer and the gate dielectric layer at the same time, so that a region of an upper surface of the substrate is exposed, and a plurality of double-layer polysilicon lines remain;

implanting impurities in the exposed region to form a plurality of source/drain regions which serve as bit lines;

patterning the double-layer polysilicon lines to form a plurality of gates, wherein each of the gates combines with the adjacent source/drain regions to form memory cells including a first memory cell, a second memory cell, a third memory cell, and a fourth memory cell;

forming an insulating layer over the substrate and the memory cells;

patterning the first memory cell and the second memory cell so that a portion of the first dielectric layer of the first memory cell and the second memory cell is exposed; and patterning the first memory cell so that a portion of the first polysilicon layer of the first memory cell is exposed, and patterning the third memory cell so that a portion of the second dielectric layer of the third memory cell is exposed.

2. A method according to claim 1, wherein the semiconductor substrate includes silicon.

3. A method according to claim 1, wherein the gate dielectric layer includes gate oxide.

4. A method according to claim 1, wherein the first dielectric layer includes silicon oxide.

5. A method according to claim 1, wherein the second dielectric layer includes silicon nitride.

6. A method according to claim 1, wherein the insulating layer includes silicon oxide.

7. A method according to claim 1, wherein the patterning the first memory cell and patterning the third memory cell further includes forming a conductive layer over the insulating layer.

8. A method according to claim 1, wherein the forming an insulating layer over the substrate and the memory cells further includes planarizing the insulating layer.

9. A method according to claim 8, wherein the planarizing the insulating layer includes chemical mechanical polishing.

10. A method according to claim 8, wherein the planarizing the insulating layer includes etching back the insulating layer.

11. A method of forming a read only memory, comprising successively forming a gate oxide layer, a first polysilicon layer, an oxide layer, a second polysilicon layer and a silicon nitride layer, over a silicon substrate;

patterning the silicon nitride layer, the second polysilicon layer, the oxide layer, the first polysilicon layer and the gate oxide layer at the same time so that a region of an upper surface of the substrate is exposed, and a plurality of double-layer polysilicon lines remain;

implanting impurities in the exposed region to form a plurality of source/drain regions;

patterning the double-layer polysilicon lines to form a plurality of gates, wherein each of the gates combines with the adjacent source/drain regions to form memory cells, including a first memory cell, a second memory cell, a third memory cell, and a fourth memory cell;

forming a planarized insulating layer over the substrate and the memory cells;

patterning the first memory cell and the second memory cell so that a portion of the oxide layer of the first memory cell and the second memory cell is exposed;

patterning the first memory cell so that a portion of the first polysilicon layer of the first memory cell is exposed, and patterning the third memory cell so that a portion of the silicon nitride layer of the third memory cell is exposed; and forming a conductive layer over the insulating layer.

* * * * *